(12) United States Patent
Honda et al.

(10) Patent No.: US 7,641,774 B2
(45) Date of Patent: Jan. 5, 2010

(54) MANUFACTURING PROCESS FOR PERPENDICULAR MAGNETIC RECORDING MEDIUM

(75) Inventors: Yoshinori Honda, Kanagawa (JP); Takayuki Ichihara, Tokyo (JP); Hiroyuki Nakagawa, Kanagawa (JP); Kiwamu Tanahashi, Tokyo (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 767 days.

(21) Appl. No.: 11/259,409

(22) Filed: Oct. 25, 2005

(65) Prior Publication Data

US 2006/0090998 A1 May 4, 2006

(30) Foreign Application Priority Data

Oct. 28, 2004 (JP) .............................. 2004-314327

(51) Int. Cl.
*C23C 14/34* (2006.01)
(52) U.S. Cl. .................... 204/192.2; 427/127; 427/128; 427/131
(58) Field of Classification Search .............. 204/192.2; 427/127, 128, 131
See application file for complete search history.

(56) References Cited

U.S. PATENT DOCUMENTS

| 4,814,056 | A | * | 3/1989 | Welty ..................... 204/298.11 |
| 5,976,688 | A | * | 11/1999 | Kawase et al. .............. 428/332 |
| 2004/0185308 | A1 | * | 9/2004 | Koda et al. ............. 428/694 TS |
| 2004/0247941 | A1 | * | 12/2004 | Chen et al. ............... 428/694 T |
| 2004/0253486 | A1 | * | 12/2004 | Chen et al. ............. 428/694 TS |

FOREIGN PATENT DOCUMENTS

JP       2002-342908       11/2002

OTHER PUBLICATIONS

M. Zheng et al., "Role of Oxygen Incorporation in Co-Cr-Pt-Si-O Perpendicular Magnetic Recording Media", IEEE Transactions on Magnetics, vol. 40, No. 4, Jul. 2004, pp. 2498-2500.

* cited by examiner

*Primary Examiner*—Rodney G McDonald
(74) *Attorney, Agent, or Firm*—Townsend and Townsend and Crew LLP; Darren Gold

(57) ABSTRACT

A perpendicular magnetic recording medium is manufactured having excellent thermal stability and recording performances across the entire disk surface. In one embodiment, the recording layer includes at least two layers deposited by using a reactive sputtering method under an oxygen-containing atmosphere at a deposition rate larger than the second recording layer which is formed on the first recording layer while depositing the first recording layer on the intermediate layer.

16 Claims, 14 Drawing Sheets

(a)

(b)

Fig. 5
(a)
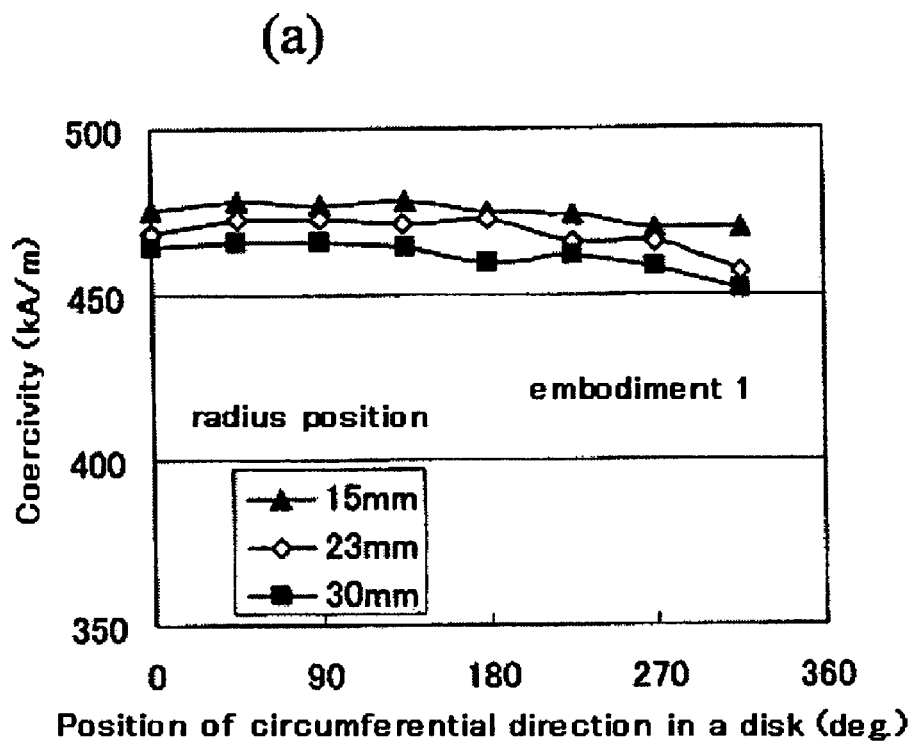
(b)
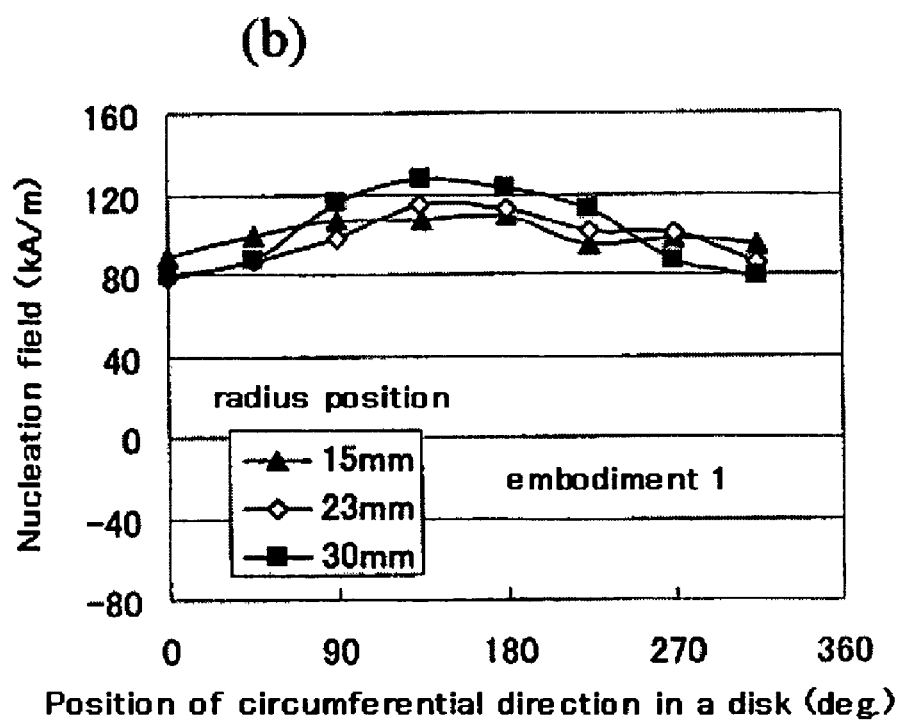

Fig. 8
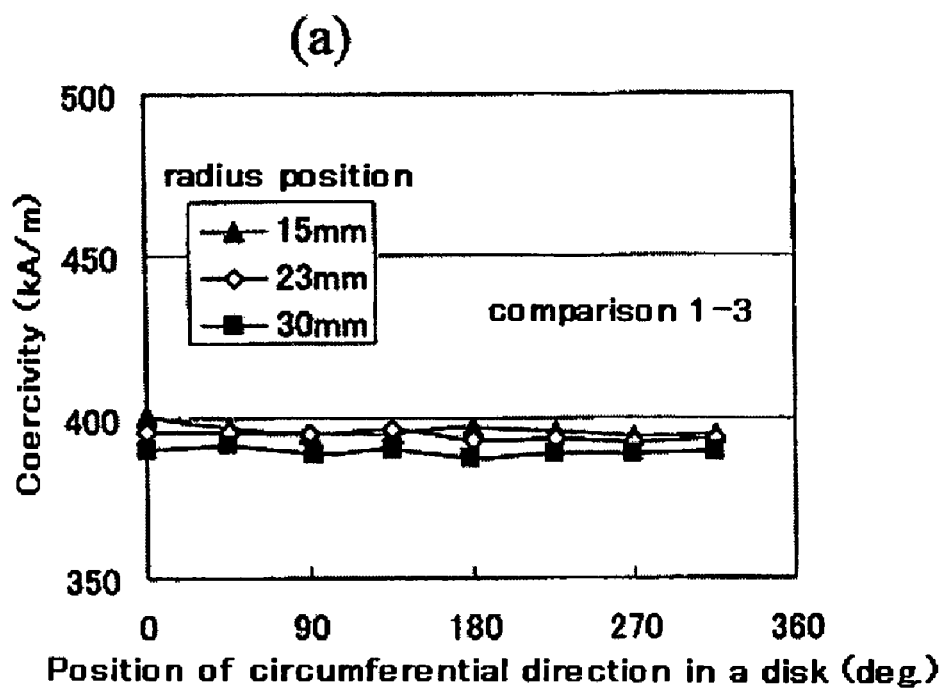
(a)
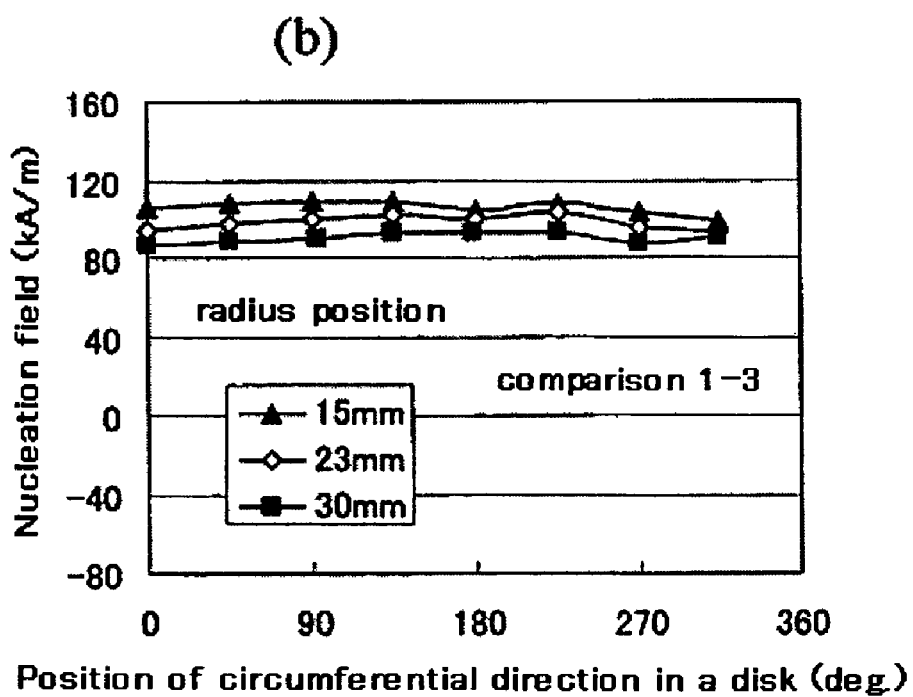
(b)

Fig. 1 5
(a)
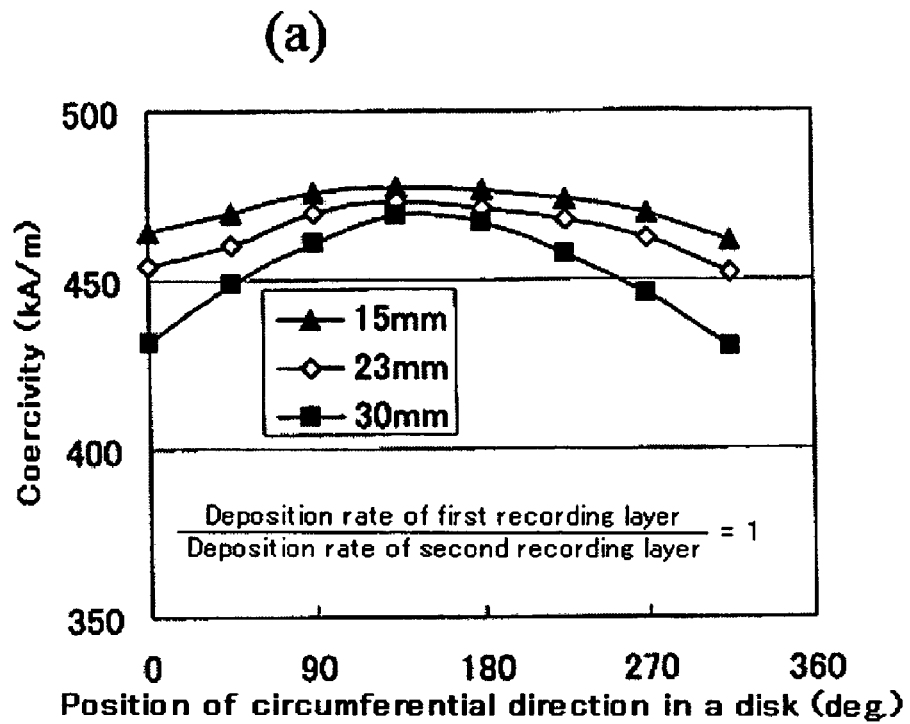
(b)
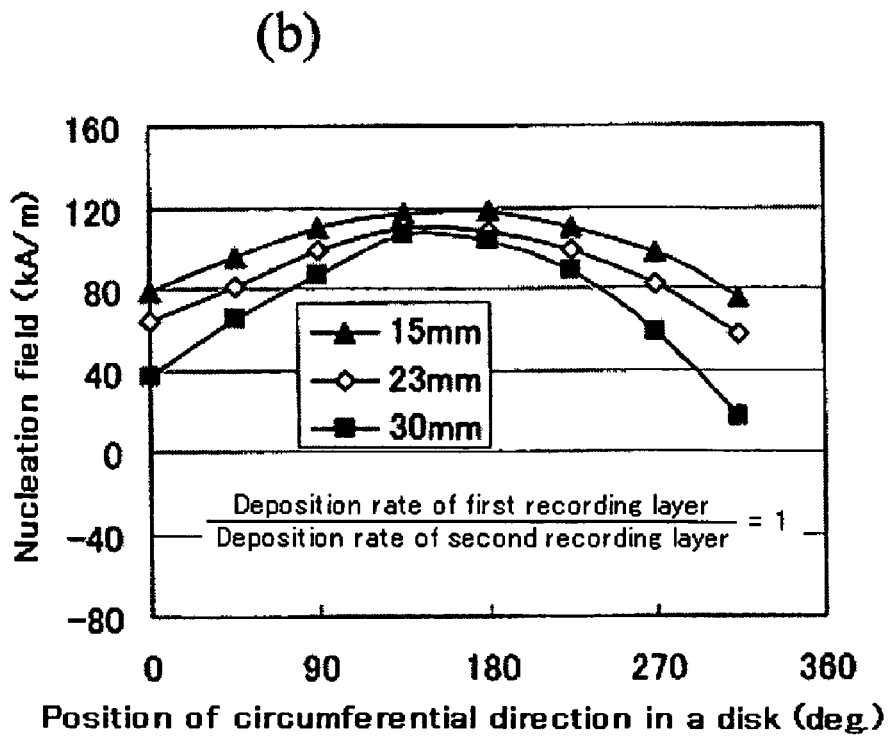

Fig. 1 6
(a)
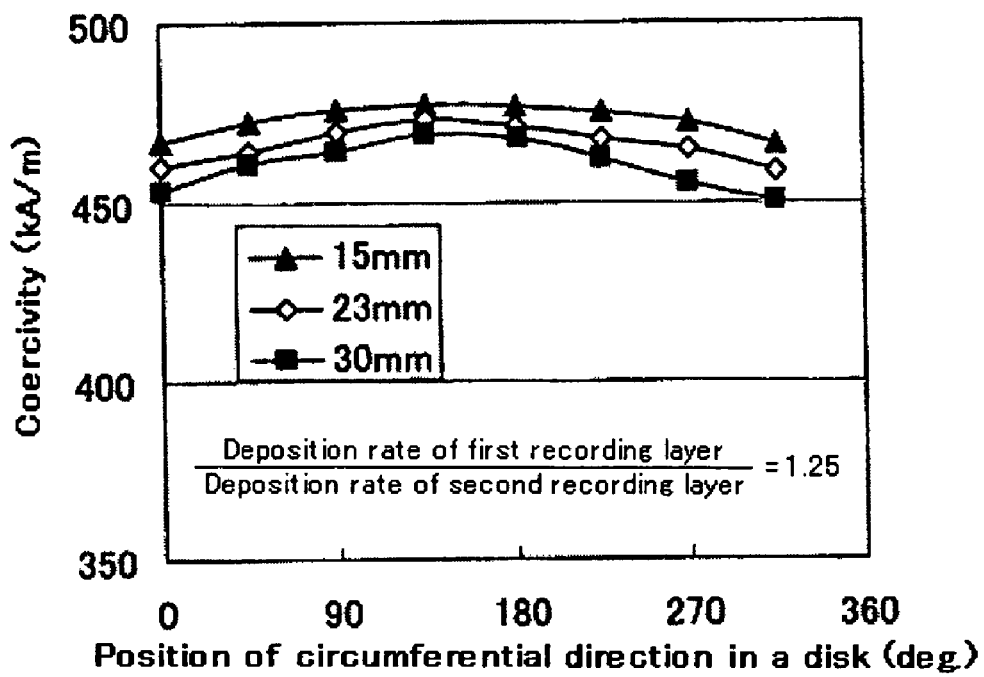
(b)
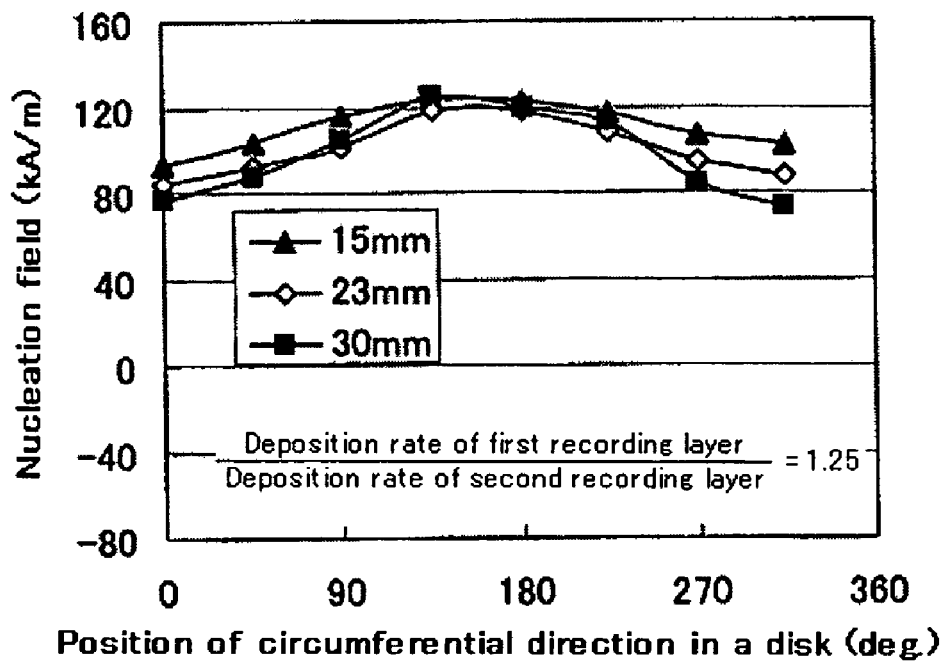

Fig. 17
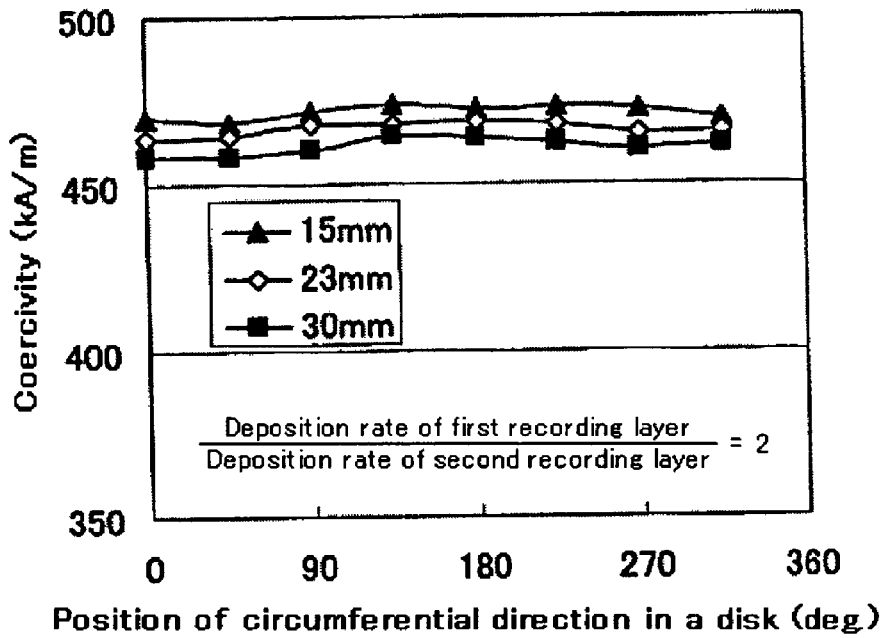
(a)
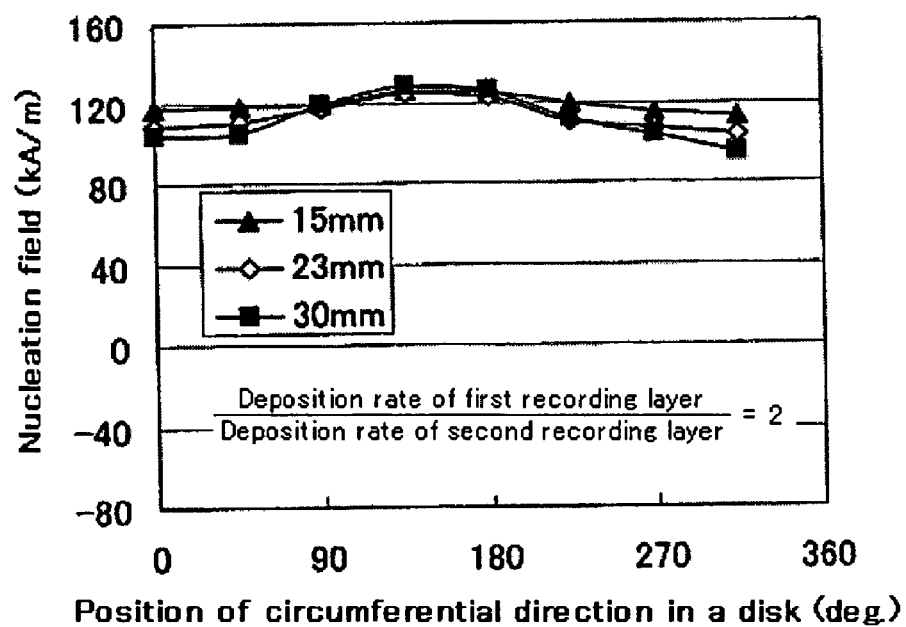
(b)

MANUFACTURING PROCESS FOR PERPENDICULAR MAGNETIC RECORDING MEDIUM

CROSS-REFERENCES TO RELATED APPLICATIONS

This application claims priority from Japanese Patent Application No. JP2004-314327, filed Oct. 28, 2004, the entire disclosure of which is incorporated herein by reference.

BACKGROUND OF THE INVENTION

The present invention relates to a perpendicular magnetic recording medium in which mass information can be recorded.

In a longitudinal magnetic recording system used in current magnetic disk storage equipment, it is necessary to increase the coercivity of the recording layer and decrease film thickness in order to increase the linear recording density, because the magnetization recorded in the medium is adjoined in mutually opposite directions. However, a problem arises that the write magnetic field of the recording head becomes insufficient when the coercivity of the recording layer is increased, and that recorded information may be lost due to thermal fluctuations when the film thickness of the recording layer is decreased. Because of problems like these, improving the recording density using a longitudinal magnetic recording system becomes difficult. Attention has been paid to a perpendicular magnetic recording system in order to solve these problems. A perpendicular magnetic recording system is a system of forming recorded bits so that a recording medium will be magnetized perpendicularly to the surface of the recording medium and the magnetization directions in adjacent recorded bits will be anti-parallel to each other. Since the demagnetization field in the magnetic transition region is small compared to a longitudinal recording system, the medium noise can be reduced and the recording magnetization can be stably maintained during high density recording.

As a magnetic recording layer (recording layer and magnetic layer) of the perpendicular magnetic recording medium, Co—Cr—Pt-based alloy films, which are also used for a longitudinal magnetic recording medium, have been studied. Reduction of the crystal grain size in the recording layer, reduction of the grain size distribution, and reduction of inter-granular exchange coupling are important for reducing the noise and improving the thermal stability of the medium using these recording layers. In the case when the Co—Cr—Pt-based alloy films are used for the magnetic recording layer, the c-axis of the hexagonal close-packed (hcp) structure is aligned all together in a direction perpendicular to the film surface, and only a slight difference of the in-plane crystallographic orientation exists in the adjoining crystal grains. Because of this, Cr segregation to the grain boundaries hardly occurs. This results in insufficient magnetic decoupling of crystal grains and/or an increase in crystal grain size due to coalescence of crystal grains in the course of crystal growth. Consequently, it is difficult to obtain low noise characteristics.

In order to solve problems like these, a granular medium has been proposed in which crystal grains are surrounded by non-magnetic compounds such as oxides and nitrides. For instance, JP-A No. 342908/2002 discloses a manufacturing process in which a recording layer mainly composed of a CoCrPt-based alloy includes Si oxides and the Si content, converted to Si atoms, is 8 at. % or more and 16 at. % or less, and the recording layer is deposited in a chamber under an Ar gas pressure of 0.133 Pa or more and 2.66 Pa or less by sputtering. Because of this, it is understood that inter-granular exchange coupling of CoCrPt crystal grains can be reduced, and high coercivity and SNR can be obtained. Moreover, in IEEE Transactions on Magnetics, Vol. 40, No. 4, July 2004, pp. 2498-2500, "Role of Oxygen Incorporation in Co—Cr—Pt—Si—O Perpendicular Magnetic Recording Media", a process for manufacturing a recording layer having a granular structure is disclosed in which a composite target containing a Co—Cr—Pt based alloy and $SiO_2$ is used and DC magnetron sputtering is used in an argon-oxygen mixed gas atmosphere. It is reported that performing reactive sputtering in an oxygen-containing atmosphere not only increases the coercivity but also improves the recording performances. Moreover, it is reported that the appropriate oxygen partial pressure is decided depending on the $SiO_2$ concentration, and the appropriate oxygen partial pressure becomes higher with lower $SiO_2$ concentration, and that the magnetic properties and recording performances deteriorate drastically when the oxygen concentration exceeds the appropriate value and reaches an excessive condition. In the case when reactive sputtering is applied under an oxygen-containing atmosphere, obtaining homogeneous magnetic properties and recording performance across the entire disk surface become very difficult because the oxygen concentration taken up into the magnetic film changes depending on the position on the disk, caused by the inhomogeneity of the distribution of oxygen concentration in the sputtering chamber.

BRIEF SUMMARY OF THE INVENTION

In the prior art in which only argon is used for a sputtering gas, it is difficult to obtain a sufficiently high SNR because the magnetic decoupling of ferromagnetic crystal grains comprising the recording layer is imperfect. Moreover, in the prior art in which an argon-oxygen mixed gas is used for a sputtering gas, it is not possible to obtain adequate magnetic properties and recording performances across the entire disk surface. Therefore, in order to obtain a perpendicular magnetic recording medium which is able to record with a higher recording density, a technology to achieve excellent magnetic properties and recording performances across the entire disk surface becomes necessary.

In order to achieve further improvement of the recording density in a double layered perpendicular magnetic recording medium suitable for a high density recording, it is necessary not only to promote the magnetic decoupling of the recording layer but also to achieve excellent magnetic properties and recording performances across the entire disk surface. For instance, in the case when a CoCrPt—$SiO_2$ granular magnetic layer is used for the recording layer, magnetic decoupling of the crystal grains is promoted by forming a magnetic layer using reactive sputtering in an argon-oxygen mixed gas atmosphere. However, it is extremely difficult to make the oxygen concentration distribution homogeneous in a sputtering chamber. Therefore, the problem arises that, when the oxygen concentration in the sputtering gas is optimized from the viewpoint of the recording performances at a part of the disk surface, a condition of excess oxygen concentration is created at another part of the disk surface, resulting in the thermal stability and the recording performances being drastically deteriorated at a part of the disk. In the prior art, it was not possible to obtain excellent thermal stability and recording performances across the entire disk surface.

A feature of the present invention is to provide a perpendicular magnetic recording medium and a manufacturing process thereof which solve the problems involved in the prior art as described above, and which has excellent thermal stability and recording performances across the entire disk surface.

In accordance with an aspect of the present invention, in a manufacturing process of a perpendicular magnetic recording medium in which at least a soft-magnetic underlayer; an intermediate layer; and a recording layer consisting of magnetic crystal grains and non-magnetic grain boundaries mainly composed of oxides surrounding the crystal grains are formed in order on a non-magnetic substrate, the recording layer includes at least two layers and the first recording layer is deposited directly on the intermediate layer by using reactive sputtering in an oxygen-containing atmosphere with a higher deposition rate than the second recording layer formed directly on the first recording layer. According to this aspect, the deterioration of magnetic properties in a region of excess oxygen concentration can be prevented, resulting in excellent thermal stability and recording performances being achieved across the entire disk surface. By performing sputtering at a high deposition rate it is thought that the number of particles sputtered per unit time is increased and the ratio of particles effectively oxidized is reduced, so that the deterioration of magnetic properties in a region of excess oxygen concentration can be prevented. As a sputtering method for deposition of the recording layer, DC sputtering, a sputtering method using a DC pulse power supply (DC pulse sputtering), and a RF sputtering method can be utilized. In the case of RF sputtering, in order to obtain the same deposition rate as DC and DC pulse sputtering, it is necessary to supply nearly double the electric power, and in order to suppress the reflected waves it is necessary to realize phase matching all the time. Because of the problem of stability of discharge and the necessity of a big investment for the production facilities, DC or DC-pulse sputtering are more preferable from the viewpoint of production.

Although there is no particular limitation for the oxide contained in the recording layer, for instance, Si oxide, Ta oxide, and Ti oxide, etc. can be used. Herein, a composite target containing oxides, for instance, Si oxide, Ta oxide, and Ti oxide may be used for the target being used when the recording layer containing oxides is deposited by sputtering. A CoCrPt-based alloy not containing oxides and an alloy target in which a fourth element such as Si, Ti, and Ta, etc. is added to this CoCrPt-based alloy may also be used.

Moreover, while the first recording layer and the second recording layer are formed, sputtering is carried out by continuously changing the deposition rate, and without stopping the deposition, by making the deposition rate 0 nm/s. Consequently, the epitaxial growth of the second recording layer on the first recording layer is promoted. On the other hand, after depositing the first recording layer, once making the deposition rate 0 nm/s and stopping the deposition, in the case when the second recording layer is deposited thereafter, deterioration of both the magnetic properties and the recording performances are observed. It is thought that the reason is that the crystallographic texture is deteriorated, the crystal grain boundaries being difficult to form, and the distribution range of the grain size becoming larger because, with the surface of the first recording layer being oxidized, etc., the surface is covered with oxides and the epitaxial growth of the second recording layer is inhibited.

Adequate thermal stability can be obtained across the entire area of the disk by making the first recording layer deposition rate normalized to second recording layer deposition rate to be about 1.15 or more. Moreover, adequate SNR can be obtained across the entire area of the disk by making the above-mentioned normalized deposition rate of the first recording layer to be about 3 or less. More preferably, making the normalized deposition rate of the first recording layer about 1.15 or more and about 2 or less gives compatibility between excellent SNR and adequate thermal stability, almost without causing the deterioration of SNR across the entire area of the disk.

According to the present invention, a perpendicular magnetic recording medium suitable for a high recording density can be manufactured which has excellent thermal stability and recording performances across the entire disk surface.

BRIEF DESCRIPTION OF THE DRAWINGS

FIG. 4 is an example of a Kerr loop of a double layered perpendicular magnetic recording medium having a soft-magnetic underlayer in which FIG. 4(a) is a graph of a raw Kerr loop, and FIG. 4(b) is a graph showing a corrected Kerr loop and the definition of nucleation field (Hn).

FIG. 5 is a drawing illustrating a distribution of magnetic properties across the disk of a medium described in the embodiment 1 in which FIG. 5(a) is a distribution map of the coercivity and FIG. 5(b) is a distribution map of the nucleation field.

FIG. 6 is a drawing illustrating the distribution of magnetic properties across the disk of a medium described in the comparative example 1-1 in which FIG. 6(a) is a distribution map of the coercivity and FIG. 6(b) is a distribution map of the nucleation field.

FIG. 7 is a drawing illustrating the distribution of magnetic properties across the disk of a medium described in the comparative example 1-2 in which FIG. 7(a) is a distribution map of the coercivity and FIG. 7(b) is a distribution map of the nucleation field.

FIG. 8 is a drawing illustrating the distribution of magnetic properties across the disk of a medium described in the comparative example 1-3 in which FIG. 8(a) is a distribution map of the coercivity and FIG. 8(b) is a distribution map of the nucleation field.

FIG. 12 shows the dependence of media SNR on the first recording layer deposition rate normalized to second recording intermediate layer deposition rate in the embodiment 3.

FIG. 13 shows the dependence of signal decay rate on the first recording layer deposition rate normalized to second recording intermediate layer deposition rate in the embodiment 3.

FIG. 14 is a drawing illustrating the distribution of magnetic properties across the disk of a medium described in a comparative example in which FIG. 14(a) is a distribution map of the coercivity and FIG. 14(b) is a distribution map of the nucleation field.

FIG. 15 is a drawing illustrating the distribution of magnetic properties across the disk of a medium described in a comparative example in which FIG. 15(a) is a distribution map of the coercivity and FIG. 15(b) is a distribution map of the nucleation field.

FIG. 16 is a drawing illustrating the distribution of magnetic properties across the disk of a medium described in an embodiment of the present invention in which FIG. 16(a) is a distribution map of the coercivity and FIG. 16(b) is a distribution map of the nucleation field.

FIG. 17 is a drawing illustrating the distribution of magnetic properties across the disk of a medium described in an embodiment of the present invention in which FIG. 17(a) is a distribution map of the coercivity and FIG. 17(b) is a distribution map of the nucleation field.

DETAILED DESCRIPTION OF THE INVENTION

The present invention will be specifically explained below as exemplified by the following embodiments.

Embodiment 1

Figure 2:
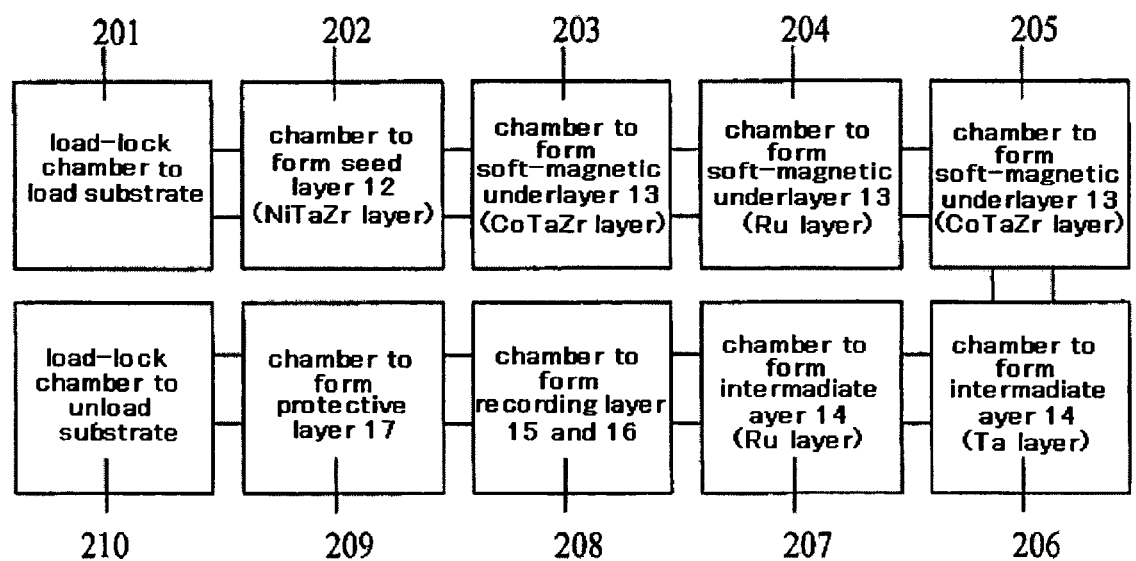
FIG. 2 is a schematic drawing illustrating an example of a sputtering apparatus to fabricate a perpendicular magnetic recording medium of the present invention.

A perpendicular magnetic recording medium of this embodiment was formed by using an in-line sputtering apparatus illustrated in FIG. 2. Each chamber is evacuated independently. The process was carried out by evacuating all process chambers to a vacuum level which is equal to or lower than $1 \times 10^{-5}$ Pa in advance and by moving a carrier on which a substrate was placed in each process chamber, in order. A carbon protective layer is formed by using a chemical vapor deposition (CVD) method and the other layers were formed by DC magnetron sputtering.

Figure 1:
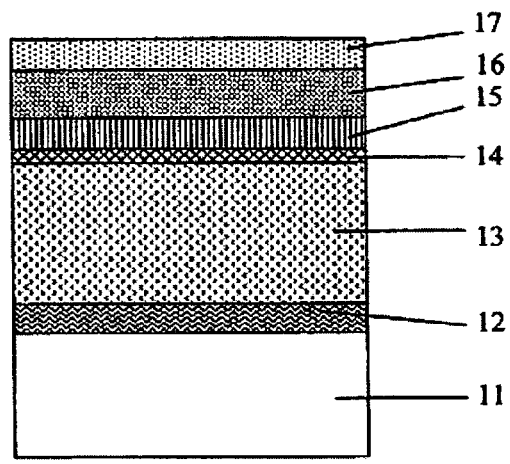
FIG. 1 is a schematic drawing of a cross-sectional structure illustrating an embodiment of a perpendicular magnetic recording medium of the present invention.
Figure 3:
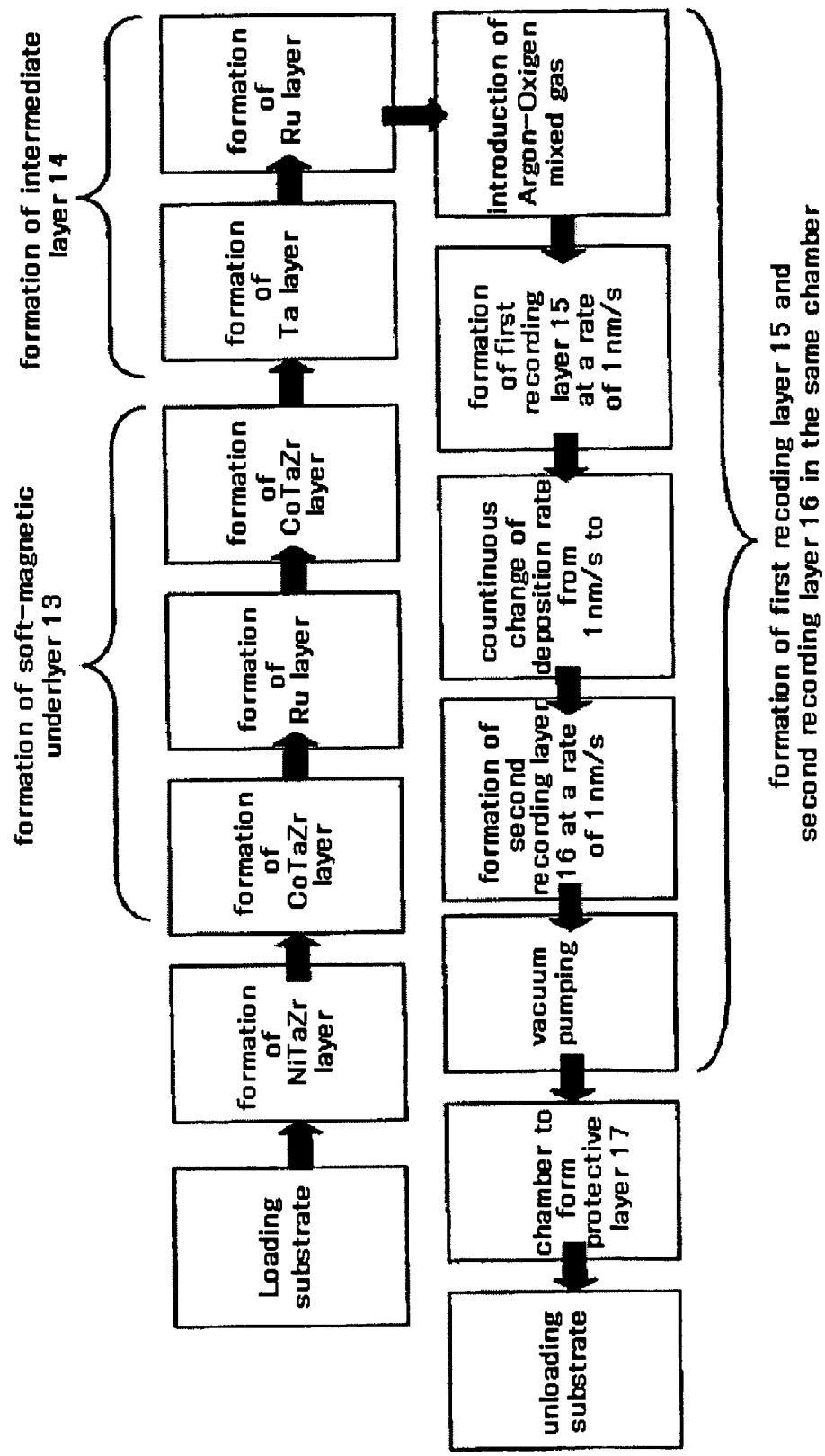
FIG. 3 is a flow chart describing an example of a process to fabricate a perpendicular magnetic recording medium of the present invention.

FIG. 1 is a schematic drawing of a cross-sectional structure illustrating an embodiment of a perpendicular magnetic recording medium of the present invention. FIG. 3 is an outline of a manufacturing sequence for the medium and process conditions are shown as follows. A glass substrate having a diameter of 63.5 mm was used for substrate 11. The substrate 11 is carried from a load-lock chamber 201 to load substrate; after vacuum evacuation, the substrate is delivered to a chamber 202 to form seed layer; and a 30 nm thick seed layer 12 composed of a NiTa-based alloy was deposited on the substrate 11 to improve the adhesion to the substrate. Ni-37.5 at. % Ta was used for the NiTa alloy herein. Any of a Ni-based alloy, a Co-based alloy, and an Al-based alloy, etc. may be used because it is enough for the seed layer 12 to maintain adhesion to both the substrate and the upper layer of the seed layer. For instance, a NiTaZr-based alloy, a NiAl-based alloy, a CoTi-based alloy, or an AlTa-based alloy, etc. can be used.

Next, in chambers 203-205 to form soft-magnetic layers, a soft-magnetic layer 13 is composed of three layers in which a 50 nm thick CoTaZr-based alloy, a 0.8 nm thick Ru, and a 50 nm thick CoTaZr-based alloy are formed in order. Co-3 at. % Ta-5 at. % Zr was used for the CoTaZr-based alloy herein. Upper and lower CoTaZr-based alloy layers are coupled antiferromagnetically through the Ru layer by taking such an AFC (antiferromagnetic coupling) configuration, resulting in noise caused by the soft magnetic layer being reduced.

The kind of soft-magnetic material and the film thickness can be selected within the range where adequate overwrite performance for writing is obtained. For instance, a CoNbZr-based alloy, a CoTaNb-based alloy, or an FeCoB-based alloy, etc. can be used in lieu of a CoTaZr-based alloy, and there is no problem if the total film thickness of the soft-magnetic material is from about 50 nm to 300 nm. A structure in which a magnetic-domain-control layer is provided to fix the magnetic domains of the soft-magnetic layer underneath the soft-magnetic layer composed of one layer of soft-magnetic material such as a CoTaZr-based alloy etc. and a structure in which a magnetic-domain-control layer is provided underneath the AFC structure may be used for the structure of the soft-magnetic layer.

Next, 1 nm thick Ta and 20 m thick Ru are formed in order in chambers 206 and 207 to form intermediate layers. An intermediate layer 14 controls the crystallographic texture and grain size of the recording layer, and plays an important role to reduce the inter-granular exchange coupling of the recording layer. The film thickness, configuration, and material of the intermediate layer 14 may be selected within the range where the above-mentioned effects can be obtained, and the present invention is not limited to the above-mentioned specific film thickness, configuration, and material. The role of the Ta layer in the above-mentioned configuration of the intermediate layer is to improve the c-axis orientation of Ru in a direction perpendicular to the film plane. The film thickness may be controlled within the range where this is satisfied, and a value from about 1 nm to 5 nm is typically used. Pd, Pt, and Cu which have a face-centered cubic (fcc) lattice structure, an alloy containing these elements, a ferromagnetic FCC material such as NiFe etc. or a material having an amorphous structure such as NiTa may be used in lieu of Ta. The role of the Ru layer is to control the grain size and crystallographic orientation of the recording layer, and to reduce the inter-granular exchange coupling of the recording layer. The film thickness may be controlled within the range where this is satisfied, and a value from about 3 m to 30 nm is typically used. Moreover, a Ru-based material containing oxides such as $SiO_2$ etc. and Ru-based alloy may be used in lieu of Ru.

Next, after delivering it to a chamber 208 to form recording layer, an argon-oxygen mixed gas was introduced, a 3 nm thick first recording layer 15 and an 11 nm thick second recording layer 16 are deposited in order in the same chamber, and residual oxygen in the chamber is reduced by evacuating to 0.5 Pa or less. A composite target containing Co-14 at. % Cr-20 at. % Pt alloy and $SiO_2$ with a ratio of 92:8 mol % was used for deposition of the first recording layer 15 and the second recording layer 16. The deposition rate when the first recording layer 15 and second recording layer 16 are formed are controlled to be 1 nm/s and 0.75 nm/s, respectively. The first recording layer and the second recording layer were formed continuously in the same chamber and using the same target by changing the deposition rate without stopping the deposition.

Subsequently, after delivering it to a chamber 209 to form carbon protective layer, a 4 nm thick DLC (diamond like carbon) film was formed as a protective layer 17 by using a CVD method. The film thickness was controlled to be 4 nm. Then, after taking the substrate out to a load-lock chamber 210 to unload substrate, the chamber was vented to atmospheric pressure and the substrate was taken out from the sputtering apparatus, and a lubricant layer was formed thereon by applying an organic-based lubricant.

Argon gas was used for a sputtering gas when a Ru layer of the intermediate layer 14 was formed. There is no problem when the gas pressure was controlled to be from about 2 Pa to 6 Pa, and 5 Pa was selected herein. An argon-oxygen mixed gas was used for a sputtering gas when the recording layers 15 and 16 were formed. There is no problem when the total gas pressure is from about 3 Pa to 6 Pa, and 4 Pa was selected herein. The oxygen concentration in the argon-oxygen mixed gas may be controlled within a range to obtain an adequate SNR, and 0.6% was selected herein. A mixed gas in which hydrogen and nitrogen were mixed with ethylene with 20% and 2%, respectively, was used for the formation of the carbon protective layer, and 2 Pa was selected to be the total gas pressure. Deposition of the other layers was carried out under a gas pressure of 1 Pa, and argon was used for the sputtering gas.

The following three types of configurations of the recording layer were fabricated as samples to be compared with the embodiment 1. A medium in which the recording layer consists of only a 14 nm thick second recording layer formed with a deposition rate of 0.75 nm/s was produced as the comparative example 1-1, and a medium in which the recording layer consists of only a 14 nm thick first recording layer formed with a deposition rate of 1 nm/s was produced as the comparative example 1-2. A medium, in which the film configuration is the same as that of the comparative example 1-1 and the recording layer is formed only in argon gas atmosphere, was produced as the comparative example 1-3. However, in each case, the film configuration and the process conditions except for the configuration of the recording layer are the same as those of the embodiment 1-1.

Figure 4:
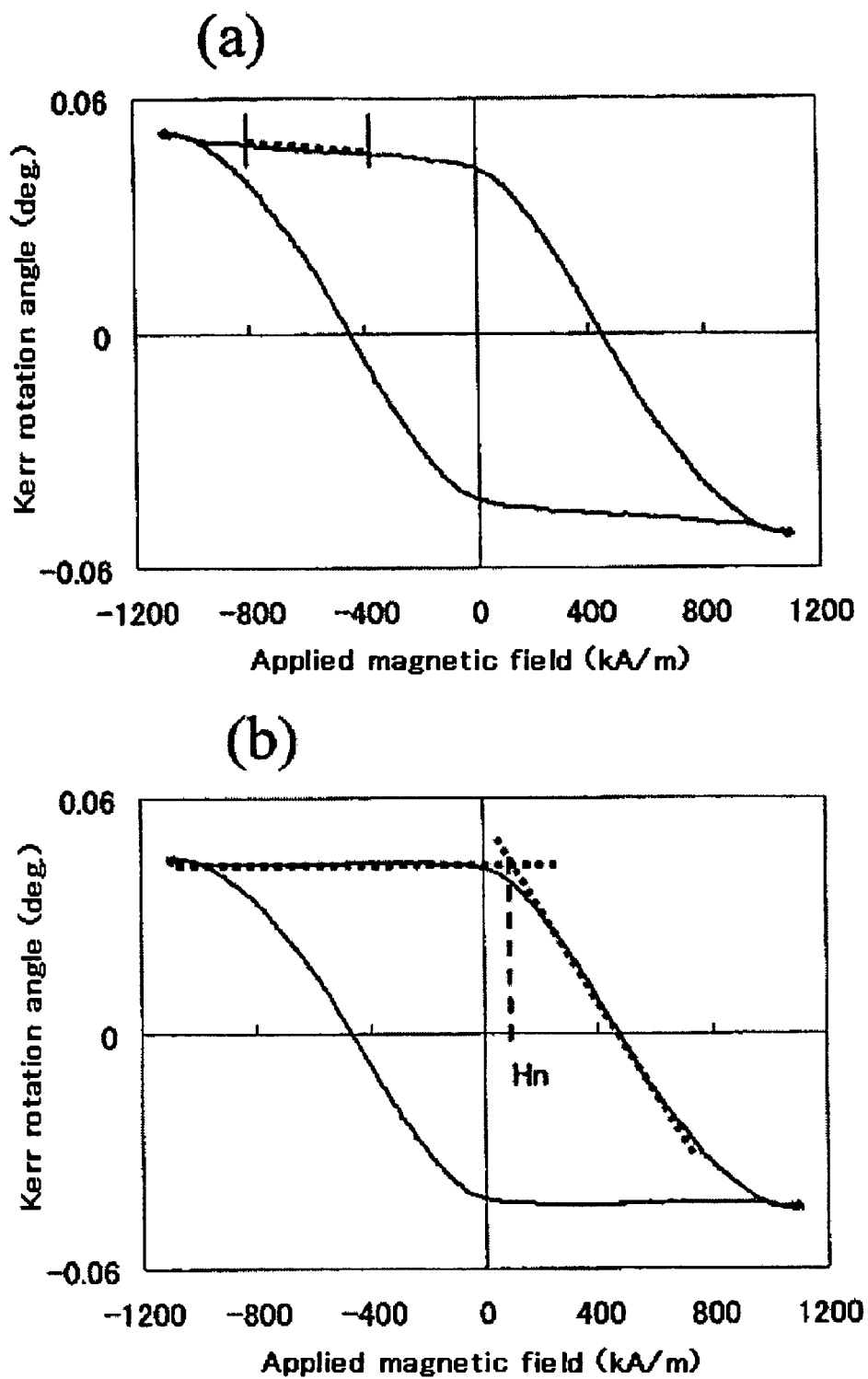

Evaluation of the magnetic properties was carried out by using a Kerr effect measuring equipment at room temperature. The measuring wavelength was 690 nm and the spot diameter of the laser was about 1 mm. The Kerr loop was measured at a constant sweep rate for 16 seconds in a magnetic field applied in a direction perpendicular to the sample film surface with a maximum magnetic field of 1185 kA/m (15 kOe). Since the laser beam reaches the soft-magnetic underlayer in the case when the film thickness of the recording layer is as thin as 14 nm, the change of Kerr rotation angle caused by magnetization of the soft-magnetic layer is added to the signal from the recording layer, resulting in a Kerr loop having a gradient as shown in FIG. 4(a). The signal caused by the soft-magnetic layer changes linearly with the magnetic field until the magnetization is saturated in the direction perpendicular to the film surface, so that the gradient in the vicinity of 395-790 kA/m (5-10 kOe) was corrected to be zero in the case of FIG. 4(a). FIG. 4(b) shows a graph after the correction. Then, the coercivity (Hc) and the nucleation field (Hn) were obtained. As shown in FIG. 4(b), Hn was defined as the value of the point of intersection between the line tangent to the Kerr loop at around the coercivity and the line tangent at the region where the Kerr rotation angle was saturated. As seen in FIG. 4(b), in the case when the gradient of the line tangent at around the coercivity is negative, the case where the point of intersection is in the first quadrant is defined as positive. On the other hand, in the case when the gradient of the line tangent at around the coercivity is positive, the case where the point of intersection is in the second quadrant is defined as positive. The Hn value is an index of thermal stability, and it is understood that the larger is the value, the better is the thermal stability.

A composite magnetic head, including a single pole write head with a track width of 150 nm and a read head utilizing a giant magnetoresistive effect with a shield gap length of 62 nm and a track width of 120 nm, was used for the evaluation of recording performances by the spin stand. Playback signals and media noise were measured under a condition where the relative velocity between head and medium was 10 m/s, the skew angle was 0°, and the magnetic spacing was about 15 nm. The media SNR was evaluated by the ratio between the playback signal at a linear recording density of 15748 fr/mm (400 kFCI) and the medium noise at a linear recording density of 15748 fr/mm (400 kFCI). Moreover, signals at a linear recording density of 3938 fr/mm (100kFCI) were recorded at room temperature, and the signal decay rate ΔS was calculated using the following expression from the playback signal S (t=10 s), when ten seconds has passed after recording, and the playback signal S (t=1000 s), when 1000 seconds has passed after recording, thereby, the thermal stability was evaluated.

$$\Delta S = [S(t=1000\ s) - S(t=10\ s)] / S(t=10\ s) / \log(1000/10)$$

FIGS. 5-8 show the results of measuring the distribution in the disk of the Hc and Hn of these media. Measurements of magnetic properties were carried out every 45 degrees in the circumferential direction at the three radial positions of 15 mm radius (near the inner radius), 23 mm (near the middle radius), and 30 mm (near the outer radius). The horizontal axis shows the position in the circumferential direction (angle) in the disk.

Figure 6:
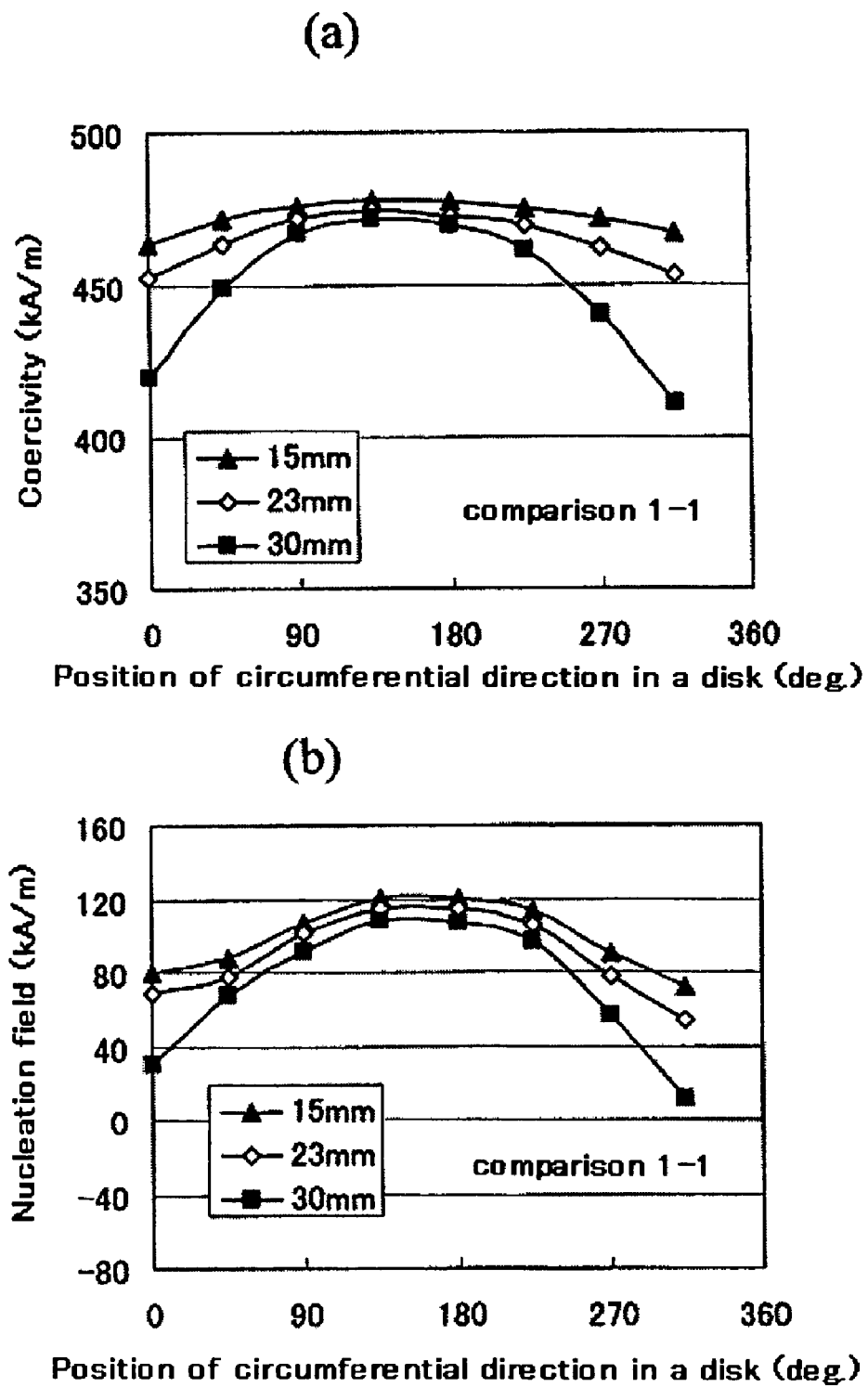

As shown in FIG. 6, the medium of the comparative example 1-1, which consists of only a second recording layer deposited with a deposition rate of 0.75 nm/s, has relatively excellent Hc and Hn values, and the distribution ranges are also relatively small near the middle and inner radius. However, near the outer radius, there are some regions in which Hc and Hn fall drastically to about 410 kA/m and 0 kA/m, respectively. It is thought from these results that there is a problem in the thermal stability.

As shown in FIG. 8, in the medium of comparative example 1-3 which consists of only a second recording layer formed in only argon gas as the sputter gas at a deposition rate of 0.75 nm/s, the distribution ranges of Hc and Hn become smaller, but the average value of Hc decreases to 400 kA/m or less. The gradient of the Kerr loop in the vicinity of the coercivity becomes larger, so that it is thought that the inter-granular exchange coupling in the recording layer becomes larger and the magnetic decoupling of crystal grains becomes less perfect.

Figure 7:
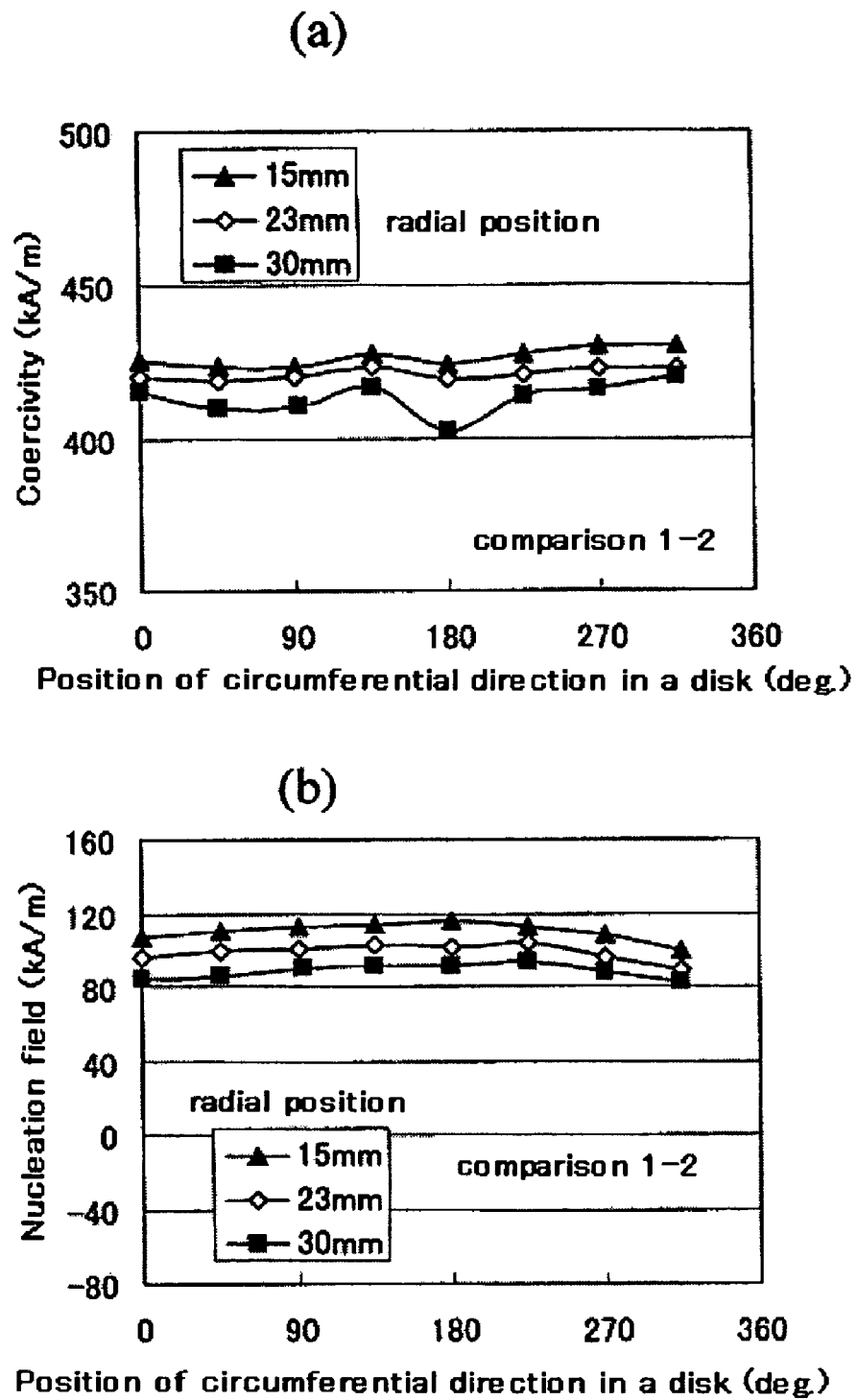

Moreover, as shown in FIG. 7, the medium of comparative example 1-2 which consists of only a first recording layer formed at a deposition rate of 1 nm/s also has small distribution ranges of Hc and Hn, but the average value of Hc decreases to 430 kA/m or less. The gradient of the Kerr loop in the vicinity of the coercivity becomes larger, so that it is thought that the inter-granular exchange coupling in the recording layer becomes larger.

On the other hand, as shown in FIG. 5, degradation of magnetic properties at the outer radius part observed in the comparative example 1-1 is decreased, and the distribution range becomes smaller in the medium of embodiment 1 in which the recording layer has a two-layer structure and the deposition rate of the first recording layer is greater than the deposition rate of the second recording layer. Moreover, a Hc value which is equal to or higher than 450 kA/m (about 5.7 kOe) and a Hn value which is equal to or higher than 70 kA/m (about 0.9 kOe) were obtained across the entire area, thereby it is thought that the thermal stability is excellent.

Figure 9:
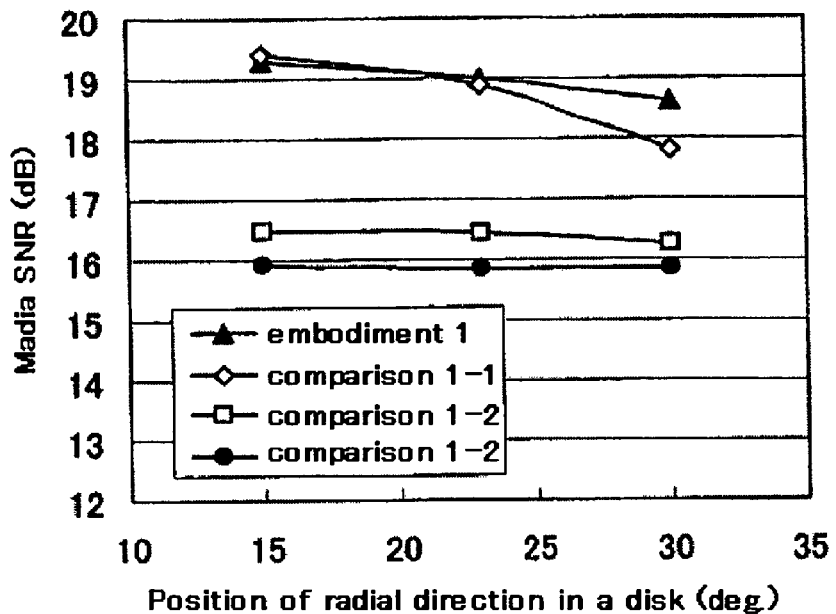
FIG. 9 is a graph showing the distribution of media SNR across the entire disk of the embodiment 1 and the comparative examples 1-1 to 1-3.
Figure 10:
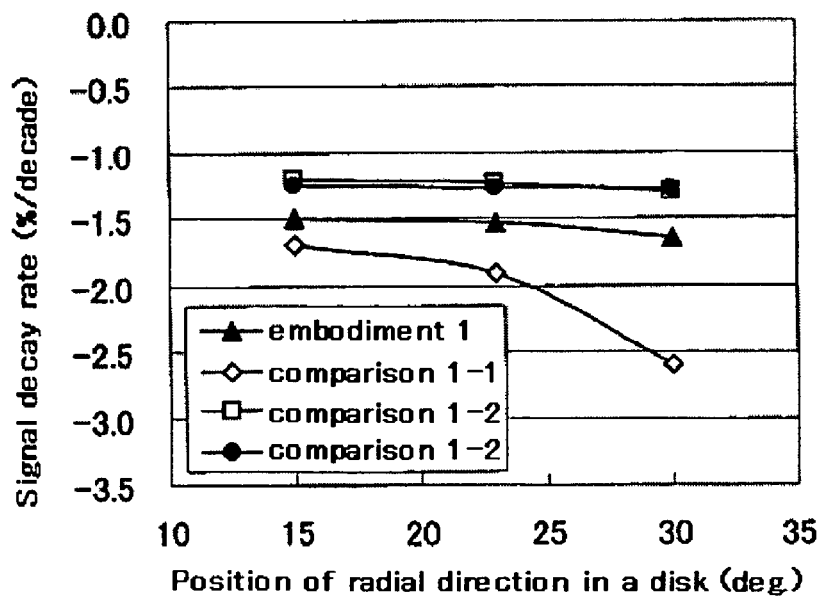
FIG. 10 is a graph showing the distribution of signal decay rate across the entire disk of the embodiment 1 and the comparative examples 1-1 to 1-3.

FIGS. 9 and 10 show SNR and signal decay rates, respectively, measured at the three radial positions of 15 mm radius (near the inner radius), 23 mm (near the middle radius), and 30 mm (near the outer radius). It is understood that high SNR and excellent thermal stability can be obtained across the entire disk surface in the medium of embodiment 1. However, the medium of the comparative example 1-2, in which the recording layer consists of only a 14 nm thick first recording layer formed at a deposition rate of 1 nm/s, and the medium of the comparative example 1-3, in which the recording layer consists of only a 14 nm thick second recording layer formed at a deposition rate of 0.75 nm/s and in an argon gas atmosphere without oxygen, have excellent thermal stability, but the SNR decreases drastically. It is thought that this is because the magnetic decoupling of crystal grains of the recording layer is imperfect.

Moreover, in the medium of comparative example 1-1 in which the recording layer consists of only a 14 nm thick second recording layer formed at a deposition rate of 0.75 nm/s, excellent SNR and thermal stability can be obtained from the inner radius to the middle radius as shown in FIG. 9, but degradation of SNR becomes large at the outer radius. Furthermore, as shown in FIG. 10, the signal decay rate is decreased drastically, to −2.5%/decade or less, and a problem in the thermal stability arises. This result indicates that the exchange coupling can be decreased and a low medium noise can be realized by using an argon-oxygen mixed gas as a sputter gas, and that obtaining excellent magnetic properties and recording performances across the entire disk surface is difficult in the prior art because of the inhomogeneity of the oxygen concentration distribution in a sputtering chamber. As shown in this embodiment 1 it is understood that degradation of the magnetic properties can be prevented in a region of excess oxygen concentration only after the recording layer consists of at least two layers in which the first layer is formed at a greater deposition rate than the second recording layer, resulting in adequate thermal stability and excellent recording performances being achieved across the entire disk surface.

Embodiment 2

The perpendicular magnetic recording medium of this embodiment was fabricated with the same sputtering apparatus, layer configuration, and process condition as those of the above-mentioned embodiment 1. However, a composite target containing Co-13 at. % Cr-20 at. % Pt and $SiO_2$ with a ratio of 92:8 mol % was used for formation of the recording layer. Moreover, the medium of embodiment 2 was fabricated under the following conditions: the oxygen concentration of the argon-oxygen mixed gas was controlled to be 0.7% while forming the recording layer, the film thickness of the first recording layer 15 was 4 nm, the film thickness of the second recording layer 16 was 10 nm, while their respective deposition rates were 1.2 nm/s and 0.9 nm/s, and input power was changed continuously.

As a comparative example, a medium was fabricated as the comparative example 2 in which formation was stopped once (deposition rate of 0 nm/s) after formation of the first recording layer, and then the second recording layer was formed. Then, the magnetic properties and the recording performances were evaluated in the same manner as the embodiment 1. Table 1 shows average and minimum values of Hc, Hn, SNR, and signal decay rate. Herein, the values of Hc and Hn were the average and minimum values of 24 measured points. SNR and the signal decay rates were the average and minimum values of three measured points at a radius of 15 mm, 23 mm, and 30 mm.

tus, layer configuration, and process conditions as those of above-mentioned embodiment 1. However, a composite target containing Co-13 at. % Cr-20 at. % Pt and $SiO_2$ with a ratio of 92:8 mol % and a DC pulse sputtering method were used for formation of the recording layer.

Figure 11:
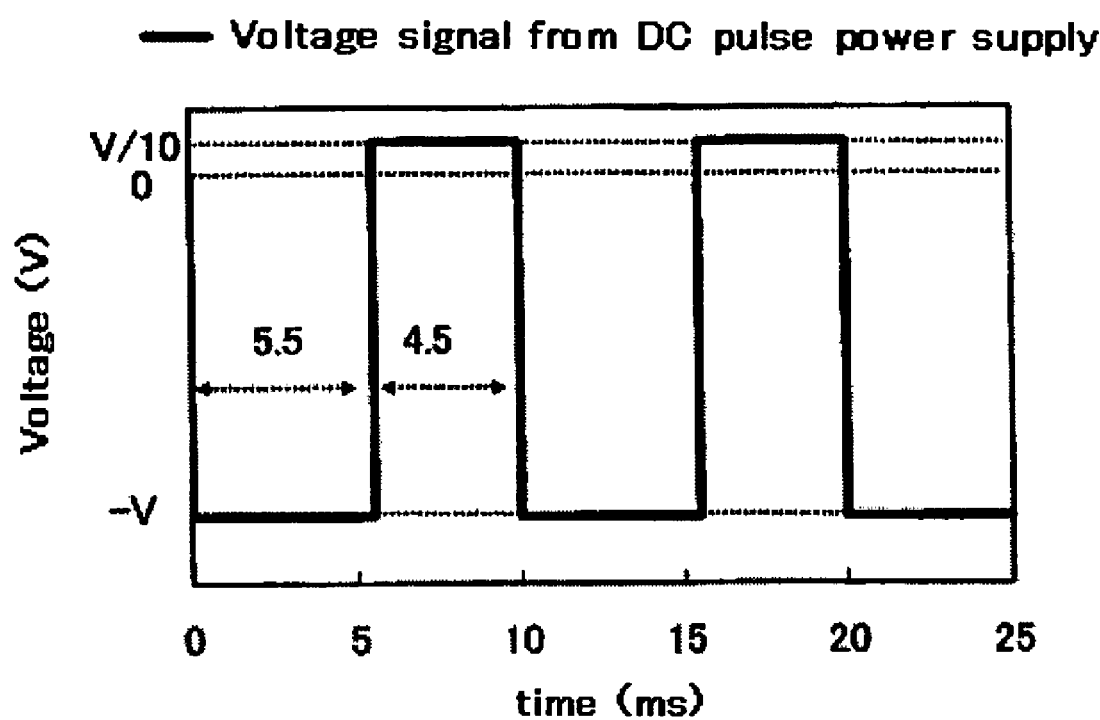
FIG. 11 shows an enlarged drawing illustrating a part of the voltage signal from a DC pulse power supply which was used for the formation of the first and the second recording layers of the embodiment 3.
Figure 1:
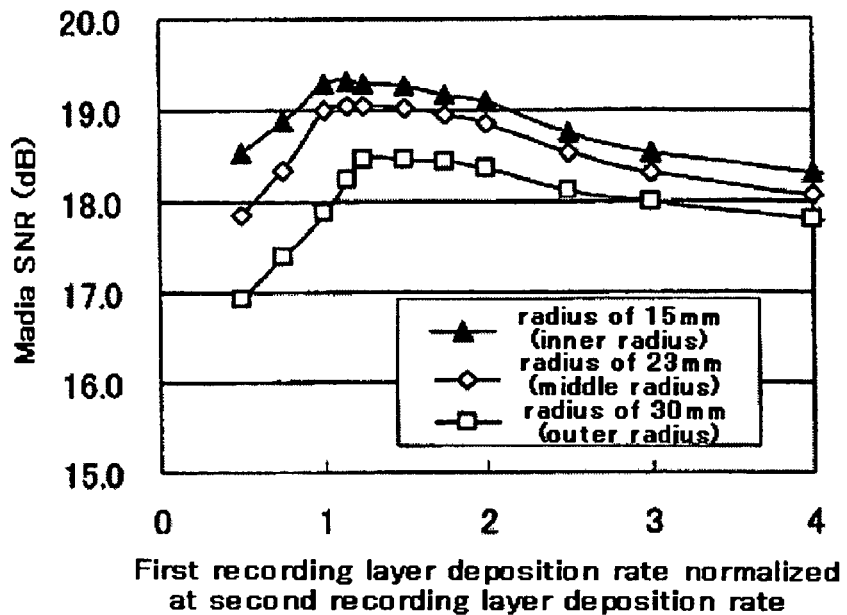
Figure 1:
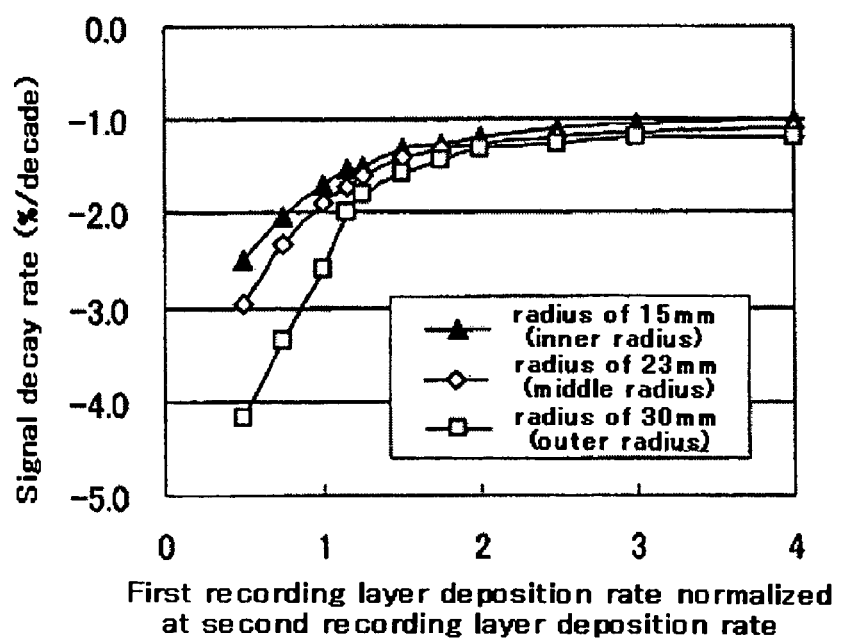
Figure 1:
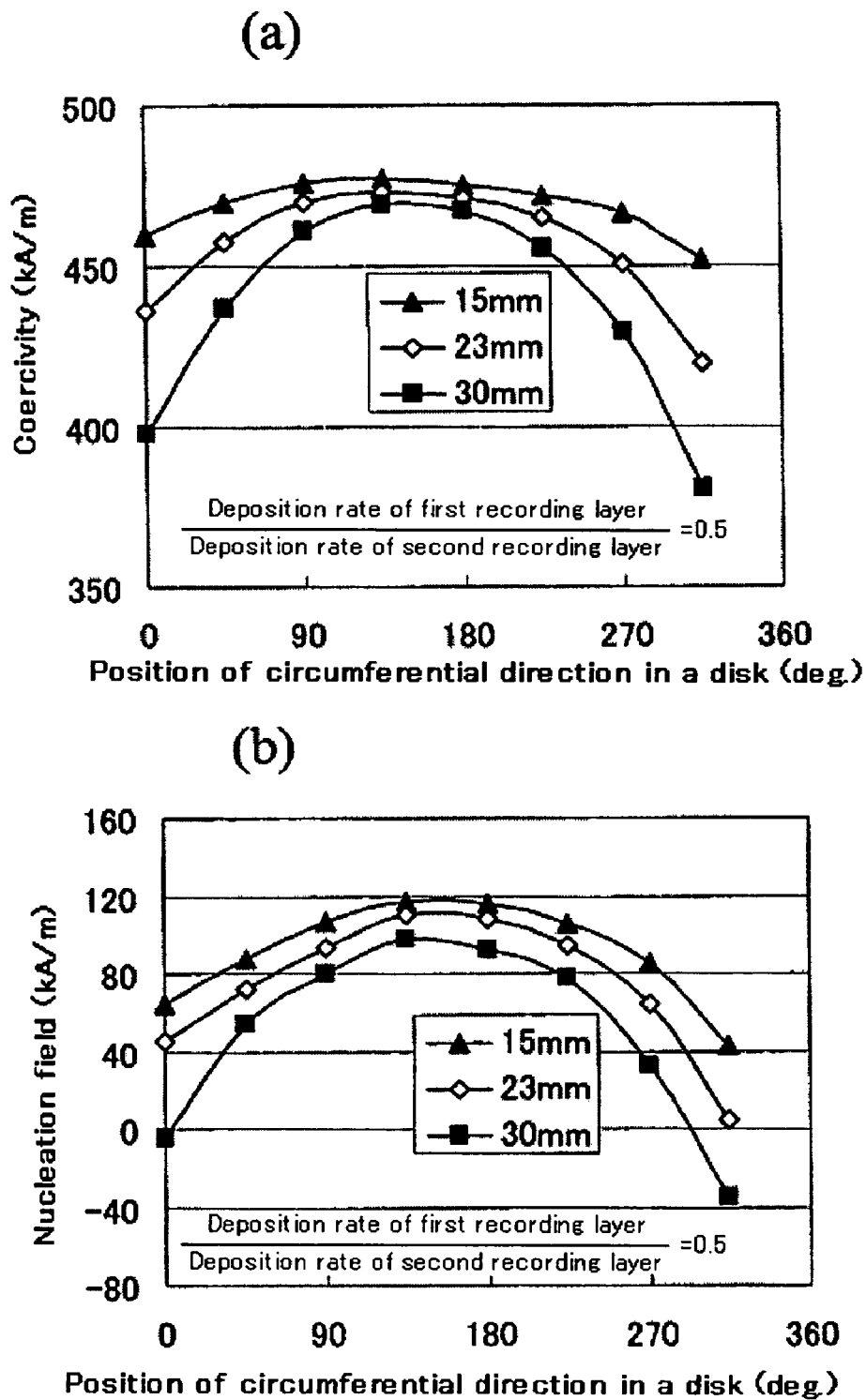

FIG. 11 is a schematic drawing illustrating a part of the voltage signal cut off from the output voltage from a DC pulse power supply. When a negative applied voltage (V1) is V1=−V, a positive applied voltage (V2) is set to be V2=V/10. Moreover, the applied time of the negative voltage (t1) is set to 5.5 μs, the applied time of the positive voltage (t2) is set to 4.5 μs, and the period (T=t1+t2) is set to 10 μs (frequency 100 kHz). A buildup of positive charge on the insulator of the target surface is cleared by applying such a pulse-like voltage to the target, and the generation of an arc can be suppressed. As a result, defects in the disk are reduced, and reliability is improved. The value of period T, the ratio of t1 and t2, and the values of V1 and V2 only have to be controlled in a range where the buildup of positive charge on the insulator of the target surface is cleared to obtain a desirable deposition rate, and they are not limited to the above-mentioned values.

Moreover, the first recording layer and the second recording layer were formed continuously without stopping deposition under the following conditions: the total gas pressure of the argon-oxygen mixed gas was controlled to be 5 Pa while forming the recording layer, the oxygen concentration therein was 0.5%, the film thickness of the first recording layer 15 was 2 nm, and the film thickness of the second recording layer 16 was 12 nm. The medium was fabricated with the deposition rate of the second recording layer fixed at 0.8 nm/s and the deposition rate of the first recording layer varied in a range from 0.5 times to 4 times this. Media which are fabricated with the first recording layer deposition rate normalized to the second recording layer deposition rate being within the range

TABLE 1

| | Hc | | Hn | | Medium SNR | | Signal decay rate | |
|---|---|---|---|---|---|---|---|---|
| | Average value (kA/m) | Minimum value (kA/m) | Average value (kA/m) | Minimum value (kA/m) | Average value (dB) | Minimum value (dB) | Average value (%/decade) | Minimum value (%/decade) |
| Embodiment 2 | 475 | 460 | 105 | 80 | 18.7 | 18.3 | −1.5 | −1.55 |
| Comparative Example 2 | 455 | 400 | 83 | 5 | 18.2 | 17.5 | −2.2 | −2.9 |

The medium of embodiment 2 has larger average and minimum values of Hc, Hn, and signal decay rate compared with the medium of comparative example 2 in which deposition was stopped once after depositing the first recording layer and then the second recording layer formed. Therefore, it is understood that excellent magnetic properties and recording performance can be obtained across the entire disk surface. In the medium of comparative example 2, epitaxial growth of the second recording layer is inhibited by stopping deposition while forming the first recording layer and the second recording layer because the surface of the first recording layer is exposed to an oxygen-containing gas and is oxidized, and because oxides such as $SiO_2$, etc. are segregated to the surface. As a result, it is thought that the reasons for the deterioration of the magnetic properties and recording performances are that the crystal grain boundaries become difficult to form, the distribution range of the crystal grain size becomes larger, and the crystallographic texture deteriorates, etc.

Embodiment 3

The perpendicular magnetic recording medium of this embodiment was fabricated with the same sputtering apparafrom 0.5 to 1 are comparative examples, and media fabricated at a value greater than about 1 are embodiments of the present invention.

The magnetic properties and the recording performances were evaluated in the same manner as the embodiment 1. The dependence of SNR and signal decay rate on the first recording layer deposition rate normalized to the second recording layer deposition rate are shown in FIGS. 12 and 13, respectively.

As shown in FIG. 13, it is understood that the thermal stability is improved across the entire region of the disk surface in a medium of this embodiment in which the deposition rate of the first recording layer was made higher than the deposition rate of the second recording layer (the normalized first recording layer deposition rate was made greater than 1). The outer radius part is usually used for a servo field and the hard disk system does not work at all when the signal of this region disappears due to the thermal fluctuation. Therefore, improvement of the thermal stability of the outer radius part is extremely important.

In this embodiment, when the first recording layer deposition rate normalized to the second recording layer deposition rate is controlled to be 1.15 or more, the signal decay rate is improved by 0.5%/decade or more to be −2%/decade or more even at a radius of 30 mm where the signal decays most, resulting in sufficient thermal stability being obtained to maintain the servo signal. On the other hand, in the case when the second recording layer deposition rate normalized to the first recording layer deposition rate is controlled to be 1 or less, the thermal stability deteriorates drastically and, specifically, the signal decay rate at a radius of 30 mm becomes −2.5%/decade or less, thereby, posing an obstacle to maintain the servo signal.

According to the aforementioned results, from the viewpoint of thermal stability, there is no problem if the first recording layer deposition rate normalized to the second recording layer deposition rate is about 1.15 or more.

As shown in FIG. 12, the media SNR at a radius of 30 mm is improved in this embodiment, in which the normalized first recording layer deposition rate is controlled to be in the region of 1 (excluded) to 3 (included), compared with the comparative example which was formed at the normalized first layer deposition rate of 1. Therefore, excellent SNR of 18 dB or more is obtained in all regions from the inner radius to the outer radius. Specifically, in a region in which the normalized first recording layer deposition rate is controlled to be about 1.15 or more and about 2 or less, an SNR comparable to a comparative example, which was fabricated at a normalized first recording layer deposition rate of 1, can be obtained even at the middle radius and at the inner radius.

On the other hand, in the case when the first recording layer deposition rate normalized to the second recording layer deposition rate is less than 1, the SNR deteriorates drastically across the entire area of the disk surface compared with the comparative example which was fabricated at the normalized first recording layer deposition rate of 1.

The distributions of magnetic properties for the cases when the first recording layer deposition rate normalized to the second recording layer deposition rate is 0.5, 1, 1.25, and 2 are shown in FIGS. 14 to 17, respectively. In the case of the comparative example in which the normalized first recording layer deposition rate is less than 1 as shown in FIG. 14, the distribution ranges of Hc and Hn become even greater compared with the comparative example shown in FIG. 15 in which the normalized first recording intermediate layer deposition rate is 1, and the minimum value of Hn which is an index of the thermal stability decreases to 0 kA/m or less. This corresponds to the degradation of the signal decay rate shown in FIG. 13. On the other hand, in the case of the medium of this embodiment in which the normalized first recording layer deposition rate is greater than 1 as shown in FIGS. 16 and 17, the distribution ranges of Hc and Hn become smaller compared with the comparative example shown in FIG. 15 in which the normalized first recording intermediate layer deposition rate is 1, and the minimum value of Hn which is an index of the thermal stability also increases. As a result, it is thought that the signal decay rate is improved as shown in FIG. 13.

The optimized normalized first recording layer deposition rate slightly changes depending on the distribution of oxygen concentration in the sputtering chamber. However, sufficient thermal stability can be obtained by controlling it to be about 1.15 or greater, and a serious problem such as thermal decay of servo signal can be avoided. In order to suppress the degradation of SNR and to obtain a sufficient SNR across the entire disk surface, it is preferable that the normalized first recording layer deposition rate be about 3 or less. More preferable is that the normalized first recording layer deposition rate be about 1.15 or greater and about 2 or less, thereby, excellent SNR can be compatible with thermal stability without bringing about nearly degradation of SNR across the entire disk surface.

According to the results above, it becomes obvious that by forming the recording layer such that the deposition rate of the first recording layer is larger than the deposition rate of second recording layer, the distribution of the magnetic properties is improved, and excellent thermal stability can be achieved while maintaining the SNR at a level where there is no problem across the entire area of the disk surface.

Embodiment 4

The perpendicular magnetic recording medium of this embodiment was fabricated with the same sputtering apparatus, layer configuration, and process conditions as those of the above-mentioned embodiment 3. However, the deposition rate of the second recording layer is 0.8 nm/s and the deposition rate of the first recording layer is 1.25 times 0.8 nm/s, that is, 1 nm/s. Moreover, when the recording layer is formed, a composite target containing the Co-12 at. % Cr-20 at. % Pt alloy and $SiO_2$ with a ratio of 91:9 mol %, a composite target containing the Co-15 at. % Cr-18 at. % Pt alloy and $SiO_2$ with a ratio of 92.5:7.5 mol %, a composite target containing the Co-13 at. % Cr-20 at. % Pt alloy and $TiO_2$ with a ratio of 92:8 mol %, and a composite target containing the Co-13 at. % Cr-20 at. % Pt alloy and $Ta_3O_5$ with a ratio of 92:8 mol % are used, and with the total gas pressure of the argon-oxygen mixed gas set at 5 Pa, the oxygen concentrations therein are controlled to be 0.43%, 0.65%, 0.5%, and 0.5%, respectively. These media are produced as the embodiments 4-1 to 4-4. As a comparison, a media were fabricated in which the first recording layer deposition rate normalized to the second recording layer deposition rate was 1, and they were produced as the comparative examples 4-1 to 4-4, respectively.

The magnetic properties and the recording performances were evaluated by the means similar to the embodiment 1. The distribution of the magnetic properties was improved in the media of embodiments 4-1 to 4-4 compared with the media of the comparative examples of 4-1 to 4-4. The minimum values of SNR and signal decay rate are shown in Table 2.

TABLE 2

| | Target for recording layer | Oxygen concentration of argon-oxygen mixed gas (%) | First recording layer deposition rate normalized to the second recording layer deposition rate | Minimum value of SNR (dB) | Minimum value of signal decay rate (%/decade) |
| --- | --- | --- | --- | --- | --- |
| Embodiment 4-1 | 91 mol % [Co-12 at. % Cr-20 at. % Pt]-9 mol % $SiO_2$ | 0.43 | 1.25 | 18.3 | −1.85 |

TABLE 2-continued

|  | Target for recording layer | Oxygen concentration of argon-oxygen mixed gas (%) | First recording layer deposition rate normalized to the second recording layer deposition rate | Minimum value of SNR (dB) | Minimum value of signal decay rate (%/decade) |
|---|---|---|---|---|---|
| Embodiment 4-2 | 92.5 mol %[Co-15 at. % Cr-20 at. % Pt]-7.5 mol % $SiO_2$ | 0.65 | 1.25 | 18.4 | −1.7 |
| Embodiment 4-3 | 91 mol % [Co-13 at. % Cr-20 at. % Pt]-8 mol % $TiO_2$ | 0.5 | 1.25 | 18.2 | −1.75 |
| Embodiment 4-4 | 91 mol % [Co-13 at. % Cr-20 at. % Pt]-8 mol % $Ta_2O_3$ | 0.5 | 1.25 | 18.4 | −1.85 |
| Comparative example 4-1 | 91 mol % [Co-12 at. % Cr-20 at. % Pt]-9 mol % $SiO_2$ | 0.43 | 1 | 17.5 | −3 |
| Comparative example 4-2 | 92.5 mol % [Co-15 at. % Cr-20 at. % Pt]-7.5 mol % $SiO_2$ | 0.65 | 1 | 17.6 | −2.5 |
| Comparative example 4-3 | 91 mol % [Co-13 at. % Cr-20 at. % Pt]-8 mol % $TiO_2$ | 0.5 | 1 | 17.3 | −2.6 |
| Comparative example 4-4 | 91 mol %[Co-13 at. % Cr-20 at. % Pt]-8 mol % $Ta_2O_3$ | 0.5 | 1 | 17.4 | −2.7 |

The minimum value of the signal decay rate is −2.5% or less in the comparative examples 4-1 to 4-4, which means that there is a problem in the thermal stability. On the other hand, the signal decay rate is improved to −1.85%/decade or more in the present embodiments 4-1 to 4-4, and it is understood that they have adequate thermal stability. Moreover, the minimum values of SNR are greatly improved to 18.2 dB or more in the embodiments 4-1 to 4-4, and they possess an adequate level.

The improvements in the distribution of Hc and Hn were observed in the embodiments 4-1 to 4-4 compared with the comparative examples 4-1 to 4-4.

According to the results mentioned above, it becomes obvious that excellent SNR and thermal stability can be achieved across the entire region of the disk surface by forming a recording layer such that the deposition rate of the first recording layer is larger than the deposition rate of second recording layer independent of the kind and concentration of oxide and the composition of CoCrPt-based alloy.

This invention is not limited to the above disclosed embodiments and can be applied to every kind of variation and modification, in which a granular structured recording layer containing oxide is formed in an oxygen-containing atmosphere. According to the present invention, the magnetic properties and recording performances can be improved at the parts where these properties are deteriorated due to raising the oxygen concentration locally in a sputtering chamber, resulting in excellent recording performances and thermal stability being achieved across the entire region of the disk surface.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims alone with their full scope of equivalents.

What is claimed is:

1. A process for manufacturing a perpendicular magnetic recording medium including a process for fabricating a perpendicular magnetic recording layer over a non-magnetic substrate under an oxygen-containing atmosphere, said process for fabricating the perpendicular magnetic recording layer comprising:

fabricating a lower perpendicular magnetic recording layer at a first deposition rate; and fabricating an upper perpendicular magnetic recording layer on said lower perpendicular magnetic recording layer at a second deposition rate which is lower than said first deposition rate, wherein sputtering is carried out by changing the deposition rate continuously, not stopping the film deposition, when said upper perpendicular magnetic recording layer is fabricated following formation of said lower perpendicular magnetic recording layer, and wherein a DC pulse sputtering method is used to form said lower and upper perpendicular magnetic recording layers.

2. The process for manufacturing a perpendicular magnetic recording medium according to claim 1, wherein
said perpendicular magnetic recording layer has a granular structure including magnetic crystal grains and non-magnetic grain boundaries mainly composed of oxides.

3. The process for manufacturing a perpendicular magnetic recording medium according to claim 2, wherein
said magnetic grains contain Co, Cr, and Pt, and said non-magnetic grain boundaries contain Si and O.

4. The process for manufacturing a perpendicular magnetic recording medium according to claim 1, further comprising:
fabricating a soft-magnetic underlayer on said non-magnetic substrate; and
fabricating an intermediate layer on said soft-magnetic underlayer,
wherein said lower perpendicular magnetic recording layer is formed on the top of said intermediate layer.

5. The process for manufacturing a perpendicular magnetic recording medium according to claim 1, wherein
said first deposition rate is about 1.15 times or more and about 3 times or less than said second deposition rate.

6. The process for manufacturing a perpendicular magnetic recording medium according to claim 1, wherein
said first deposition rate is about 1.15 times or more and about 2 times or less than said second deposition rate.

7. The process for manufacturing a perpendicular magnetic recording medium according to claim 1, wherein a composite target containing Co-14 at. % Cr-20 at. % Pt alloy and SiO2 with a ratio of 92:8 mol % is used for depositing said lower and upper perpendicular magnetic recording layers.

8. The process for manufacturing a perpendicular magnetic recording medium according to claim 1, wherein a composite target containing Co-13 at. % Cr-20 at. % Pt alloy and SiO2 with a ratio of 92:8 mol % is used for depositing said lower and upper perpendicular magnetic recording layers.

9. The process for manufacturing a perpendicular magnetic recording medium according to claim 1, wherein a composite target containing Co-12 at. % Cr-20 at. % Pt alloy and SiO2 with a ratio of 91:9 mol % is used for depositing said lower and upper perpendicular magnetic recording layers.

10. The process for manufacturing a perpendicular magnetic recording medium according to claim 1, wherein a composite target containing Co-15 at. % Cr-18 at. % Pt alloy and SiO2 with a ratio of 92.5:7.5 mol % is used for depositing said lower and upper perpendicular magnetic recording layers.

11. The process for manufacturing a perpendicular magnetic recording medium according to claim 1, wherein a composite target containing Co-13 at. % Cr-20 at. % Pt alloy and TiO2 with a ratio of 92:8 mol % is used for depositing said lower and upper perpendicular magnetic recording layers.

12. The process for manufacturing a perpendicular magnetic recording medium according to claim 1, wherein a composite target containing Co-13 at. % Cr-20 at. % Pt alloy and Ta3O5 with a ratio of 92:8 mol % is used for depositing said lower and upper perpendicular magnetic recording layers.

13. The process for manufacturing a perpendicular magnetic recording medium according to claim 1, wherein the first deposition rate is about 1 nm/s.

14. The process for manufacturing a perpendicular magnetic recording medium according to claim 1, wherein said upper recording layer is thicker than said lower recording layer.

15. The process for manufacturing a perpendicular magnetic recording medium according to claim 14, wherein said lower recording layer has a thickness of about 2-4 nm and said upper recording layer has a thickness of about 10-12 nm.

16. The process for manufacturing a perpendicular magnetic recording medium according to claim 15, wherein said lower and upper recording layers have a total thickness of about 14 nm.

* * * * *